United States Patent
Oh

(10) Patent No.: US 10,998,065 B2
(45) Date of Patent: May 4, 2021

(54) MEMORY DEVICE AND OPERATING METHOD THEREOF

(71) Applicant: SK hynix Inc., Icheon-si (KR)

(72) Inventor: Hae Soon Oh, Cheongju-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/670,510

(22) Filed: Oct. 31, 2019

(65) Prior Publication Data

US 2020/0321066 A1   Oct. 8, 2020

(30) Foreign Application Priority Data

Apr. 2, 2019   (KR) .................. 10-2019-0038683

(51) Int. Cl.
| | |
|---|---|
| *G11C 16/34* | (2006.01) |
| *G11C 16/16* | (2006.01) |
| *G11C 16/14* | (2006.01) |
| *G11C 16/24* | (2006.01) |
| *G11C 16/08* | (2006.01) |
| *G11C 16/30* | (2006.01) |

(52) U.S. Cl.
CPC .......... *G11C 16/3445* (2013.01); *G11C 16/08* (2013.01); *G11C 16/14* (2013.01); *G11C 16/16* (2013.01); *G11C 16/24* (2013.01); *G11C 16/30* (2013.01)

(58) Field of Classification Search
CPC ...... G11C 16/14; G11C 16/16; G11C 16/3445
USPC ........................................ 365/185.29, 185.33
See application file for complete search history.

(56) References Cited

U.S. PATENT DOCUMENTS

| | | | | |
|---|---|---|---|---|
| 8,873,301 B2* | 10/2014 | Kwon | ....................... | G11C 7/12 |
| | | | | 365/185.25 |
| 8,891,314 B2* | 11/2014 | Park | ....................... | G11C 16/32 |
| | | | | 365/185.25 |
| 9,147,478 B2* | 9/2015 | Park | ....................... | G11C 16/16 |
| 9,299,447 B2* | 3/2016 | Lee | ........... | G11C 16/16 |
| 9,305,652 B2* | 4/2016 | Kim | ..................... | G11C 16/107 |
| 9,558,835 B2* | 1/2017 | Lee | ........... | G11C 16/16 |
| 10,347,339 B2* | 7/2019 | Park | ....................... | G11C 16/08 |
| 10,410,726 B2* | 9/2019 | Kim | ........................ | G11C 16/08 |

FOREIGN PATENT DOCUMENTS

KR     1020130072665 A     7/2013

* cited by examiner

*Primary Examiner* — Son L Mai
(74) *Attorney, Agent, or Firm* — William Park & Associates Ltd.

(57) ABSTRACT

A memory device includes a memory cell block including a plurality of memory cells. The memory device also includes peripheral circuits configured to perform an erase operation by a gate induce drain leakage (GIDL) method by applying a first erase voltage and a second erase voltage to a source line of the memory cell block. The memory device further includes control logic configured to control the peripheral circuits to sequentially perform an operation of applying the first erase voltage and an operation of applying the second erase voltage during the erase operation, wherein memory cells having a plurality of program states, among the plurality of memory cells, are erased to have a pre-erase state during the operation of applying the first erase voltage.

17 Claims, 11 Drawing Sheets

MEMORY DEVICE AND OPERATING METHOD THEREOF

CROSS-REFERENCE TO RELATED APPLICATION

The present application claims priority under 35 U.S.C. § 119(a) to Korean patent application number 10-2019-0038683 filed on Apr. 2, 2019, in the Korean Intellectual Property Office, the entire disclosure of which is incorporated herein by reference.

BACKGROUND

1. Technical Field

Various embodiments relate generally to an electronic device and, more particularly, to a memory device and an operating method thereof.

2. Related Art

Today, computing is ubiquitous with computer systems available practically everywhere at any time. Further, the use of portable electronic devices, such as cellular phones, digital cameras, and laptop computers, has also surged. A portable electronic device generally uses a memory system having a memory device, i.e., a data storage device. The data storage device serves as a main storage device or an auxiliary storage device of the portable electronic device.

Memory devices used for portable electronic devices generally have excellent stability and durability because they do not have any moving mechanical parts. In addition, they also enjoy fast information access speed and low power consumption. Examples of a data storage device that may be embodied into a memory system having these advantages may include a universal serial bus (USB), a memory card having various interfaces, and a solid state drive (SSD).

Memory devices are generally classified into volatile memory devices and nonvolatile memory devices. Nonvolatile memory devices operate at relatively low write and read speeds, but they may retain stored data in the absence of power. Therefore, non-volatile memory devices may be used to store data which needs to be stored regardless of power availability. Examples of the non-volatile memory devices include Read Only Memory (ROM), Mask ROM (MROM), Programmable ROM (PROM), Erasable Programmable ROM (EPROM), Electrically Erasable and Programmable ROM (EEPROM), flash memory, Phase-change Random Access Memory (PRAM), Magnetic RAM (MRAM), Resistive RAM (RRAM), and Ferroelectric RAM (FRAM). Flash memories may be classified into NOR-type memories or NAND-type memories.

SUMMARY

Various embodiments of the present disclosure provide a memory device capable of improving an erase threshold voltage distribution and a method of operating the memory device.

According to an embodiment, a memory device may include a memory cell block including a plurality of memory cells. The memory device may include peripheral circuits configured to perform an erase operation by a gate induce drain leakage (GIDL) method by applying a first erase voltage and a second erase voltage to a source line of the memory cell block. The memory device may further include control logic configured to control the peripheral circuits to sequentially perform an operation of applying the first erase voltage and an operation of applying the second erase voltage during the erase operation, wherein memory cells having a plurality of program states, among the plurality of memory cells, are erased to have a pre-erase state during the operation of applying the first erase voltage.

According to an embodiment, a memory device may include a memory cell block including a plurality of memory cells programmed to a plurality of program states. The memory device may also include peripheral circuits configured to perform an erase operation by a gate induce drain leakage (GIDL) method by applying a first erase voltage and a second erase voltage greater than the first erase voltage to a source line of the memory cell block, the erase operation including a first erase voltage applying operation and a second erase voltage applying operation, wherein the peripheral circuits are configured to erase the plurality of memory cells to have a pre-erase state during the first erase voltage applying operation, and configured to erase the plurality of memory cells in the pre-erase state to a target erase voltage level or less during the second erase voltage applying operation.

According to an embodiment, a method of operating a memory device may include erasing a plurality of memory cells programmed to a plurality of program states to have a pre-erase state by applying a first erase voltage to a source line of a memory cell block including the plurality of memory cells. The method may further include erasing the plurality of memory cells by a gate induce drain leakage (GIDL) method so that the plurality of memory cells have threshold voltages of a target erase voltage level or less by applying a second erase voltage to the source line after the application of the first erase voltage.

DETAILED DESCRIPTION

Figure 1:
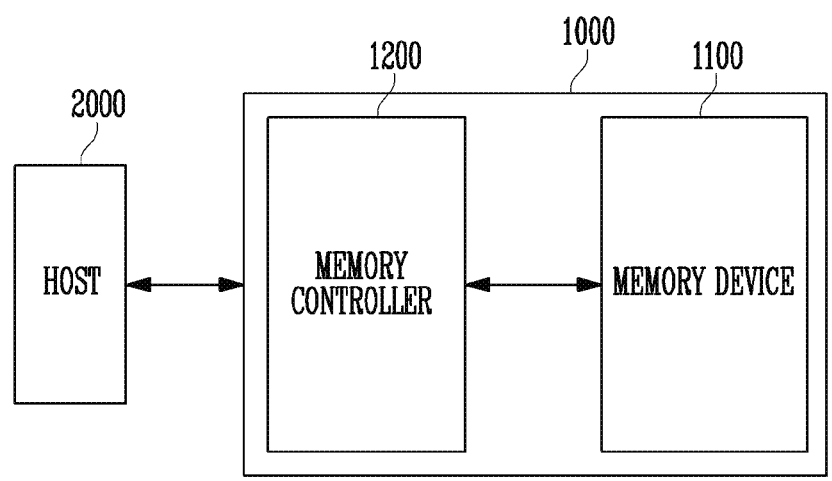
FIG. 1 is a block diagram illustrating a memory system according to an embodiment of the present disclosure.

Specific structural and functional detail is provided herein for the purpose of describing and illustrating embodiments of the present teachings. The present teachings, however, are not limited to the specific details presented. Various modifications including changes and substitutions may be made to any of the disclosed embodiments as those skilled in the art will understand from the present disclosure. Thus, the present teachings are intended to embrace all such modifications that fall within the scope of the claims.

While terms such as "first" and "second" may be used to identify various components, such components are not limited by the above terms. The above terms are used to distinguish one component from the other component that otherwise have the same or similar names. For example, a first component in one instance may be referred to as a second component in another instance, or vice versa, without departing from the spirit and scope of the present teachings.

It will be understood that when an element is referred to as being "connected" or "coupled" to another element, it can be directly connected or coupled to the other element or one or more intervening elements may also be present. In contrast, when an element is referred to as being "directly connected" or "directly coupled" to another element, no intervening elements are present. Other expressions describing relationships between components such as " . . . between," "immediately . . . between" or "adjacent to . . . " and "directly adjacent to . . . " may be construed similarly.

The terms used in the present application are merely used to describe particular embodiments, and are not intended to limit the present disclosure. Singular forms in the present disclosure are intended to include the plural forms as well, unless the context clearly indicates otherwise. In the present specification, it should be understood that terms "include" or "have" indicate that a feature, a number, a step, an operation, a component, a part or combination thereof is present, but do not exclude the possibility that one or more other features, numbers, steps, operations, components, parts or combinations thereof are present or added.

So far as not being differently defined, all terms used herein including technical or scientific terminologies have meanings that are commonly understood by those skilled in the art to which the present disclosure pertains. The terms defined in generally used dictionaries should be construed as having the same meanings as would be construed in the context of the related art, and unless clearly defined otherwise in this specification, should not be construed as having idealistic or overly formal meanings.

In some embodiments, well-known processes, device structures, and technologies are not described in detail to avoid ambiguousness of the present teachings. This intends to avoid obscuring aspects of the present teachings.

Various embodiments of the present disclosure are described in detail below with reference to the accompanying drawings in order for those skilled in the art to be able to readily implement the present teachings.

FIG. 1 is a diagram illustrating a memory system 1000 according to an embodiment of the present disclosure.

Referring to FIG. 1, the memory system 1000 may include a memory device 1100 storing data and a memory controller 1200 controlling the memory device 1100 in response to control of a host 2000.

The host 2000 may communicate with the memory system 1000 using an interface protocol such as Peripheral Component Interconnect-Express (PCI-E), Advanced Technology Attachment (ATA), Serial ATA (SATA), Parallel ATA (PATA), or serial attached SCSI (SAS). In addition, the interface protocol provided for the purpose of data communication between the host 2000 and the memory system 1000 might not be limited to the above examples and may be one of interface protocols such as a Universal Serial Bus (USB), a Multi-Media Card (MMC), an Enhanced Small Disk Interface (ESDI), and Integrated Drive Electronics (IDE).

The memory controller 1200 may control the general operations of the memory system 1000 and control data exchange between the host 2000 and the memory device 1100. For example, the memory controller 1200 may control the memory device 1100 to program, read, or erase data in response to a request from the host 2000. According to an embodiment, the memory device 1100 may include Double Data Rate Synchronous Dynamic Random Access Memory (DDR SDRAM), Low Power Double Data Rate4 (LPDDR4) SDRAM, Graphics Double Data Rate (GDDR) SDRAM, Low Power DDR (LPDDR), Rambus Dynamic Random Access Memory (RDRAM), or FLASH Memory.

The memory device 1100 may perform a program operation, a read operation, or an erase operation under the control of the memory controller 1200. The memory device 1100 may primarily erase memory cells in a program state to a pre-erase state greater than a target erase voltage level by using a first erase voltage, and may then erase the memory cells in the pre-erase state to the target erase voltage level or less by using a second erase voltage greater than the first erase voltage. Here "primarily erase" means that the memory cells are essentially erased shy of using a second erase voltage to fully erase the memory cells to a target erase voltage level.

Figure 2:
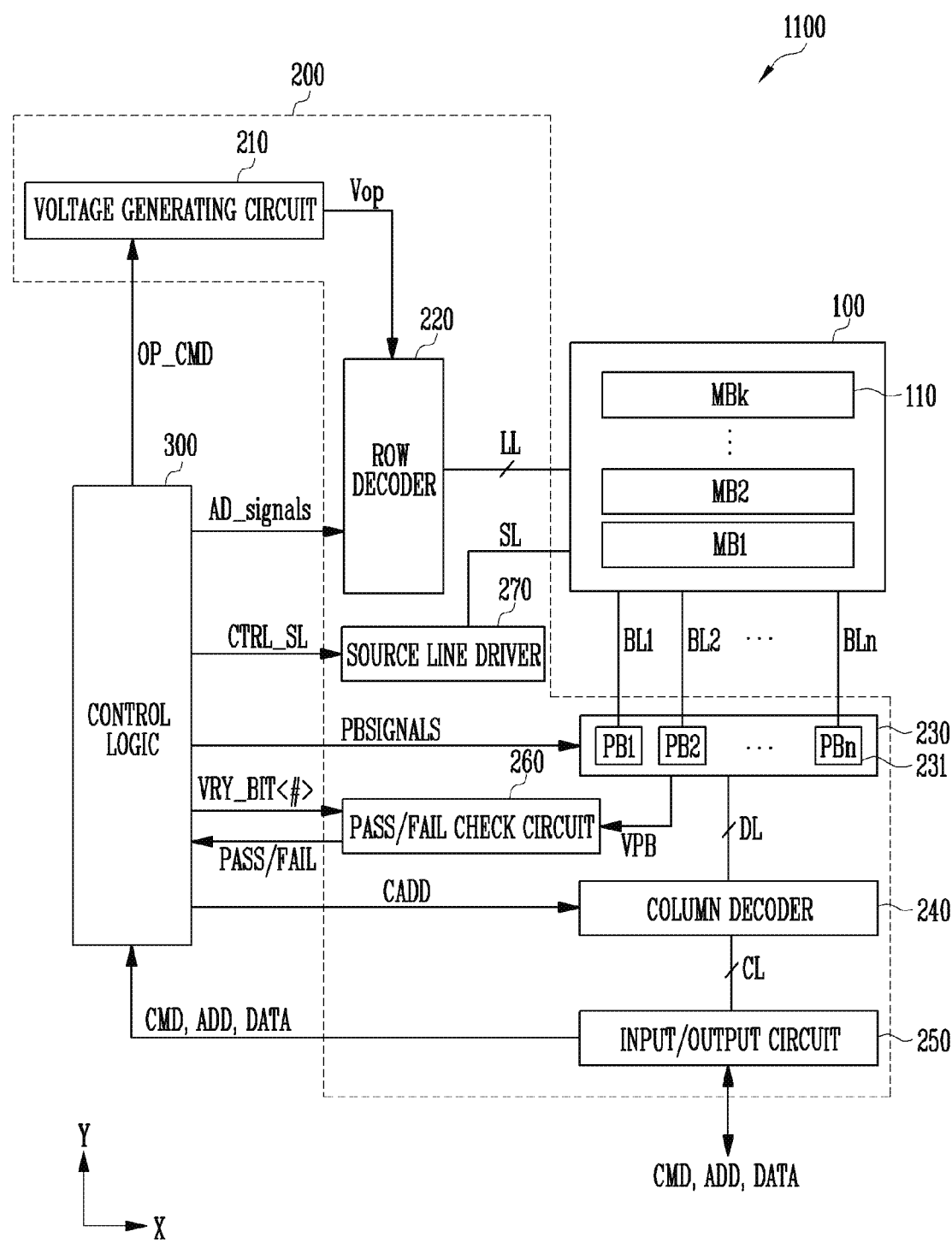
FIG. 2 is a diagram illustrating a memory device of FIG. 1.

FIG. 2 is a diagram illustrating the memory device 1100 shown in FIG. 1.

Referring to FIG. 2, the memory device 1100 may include a memory cell array 100 storing data. The memory device 1100 may include peripheral circuits 200 configured to perform a program operation to store data in the memory cell array 100, a read operation to output the stored data, and an erase operation to erase the stored data. The memory device 1100 may include control logic 300 which controls the peripheral circuits 200 in response to control of the memory controller 1200 shown in FIG. 1. The control logic 300 may be implemented as hardware, software, or a combination of hardware and software. For example, the control logic 300 may be a control logic circuit operating in accordance with an algorithm and/or a processor executing control logic code. According to an embodiment of the present disclosure, the memory device 1100 may primarily erase the memory cells included in the memory cell array 100 to a state greater than a target erase voltage by using the first erase voltage, and may then finally erase the memory cells to a state less than or equal to the target erase voltage by using a second erase voltage greater than the first erase voltage.

The memory cell array 100 may include a plurality of memory blocks (MB1 to MBk) 110, where k is a positive integer. Local lines LL and bit lines BL1 to BLn may be coupled to each of the memory blocks (MB1 to MLk) 110, where n is a positive integer. For example, the local lines LL may include a first select line, a second select line, and a plurality of word lines arranged between the first and second select lines. In addition, the local lines LL may include dummy lines arranged between the first select line and the word lines and between the second select line and the word lines. The first select line may be a source select line and the second select line may be a drain select line. For example, the local lines LL may include word lines, drain and source select lines, and source lines SL. For example, the local lines LL may further include dummy lines. For example, the local lines LL may further include pipe lines. The local lines LL may be coupled to the memory blocks (MB1 to MBk) 110, respectively, and the bit lines BL1 to BLn may be commonly coupled to the memory blocks (MB1 to MBk) 110. The memory blocks (MB1 to MBk) 110 may have a two-dimensional (2D) or three-dimensional (3D) structure. For example, in the 2D memory blocks 110, memory cells may be arranged in parallel with a substrate. For example, in the 3D memory blocks 110, memory cells may be stacked in a vertical direction to the substrate.

The peripheral circuits 200 may be configured to perform program, read, and erase operations on the selected memory block 110 in response to control of the control logic 300. For example, the peripheral circuits 200 may include a voltage generating circuit 210, a row decoder 220, a page buffer group 230, a column decoder 240, an input/output circuit 250, a pass/fail check circuit 260, and a source line driver 270.

The voltage generating circuit 210 may generate various operating voltages Vop applied to perform program, read, and erase operations in response to an operation signal OP_CMD. In addition, the voltage generating circuit 210 may selectively discharge the local lines LL in response to the operation signal OP_CMD. For example, the voltage generating circuit 210 may generate a program voltage, a verify voltage, a pass voltage, and a select transistor operating voltage in response to control of the control logic 300.

The row decoder 220 may transfer the operating voltages Vop to the local lines LL coupled to the selected memory block 110 in response to row decoder control signals AD_signals. For example, the row decoder 220 may selectively apply operating voltages, e.g., the program voltage, the verify voltage, and the pass voltage generated by the voltage generating circuit 210 to the local lines LL, or may float some lines (e.g., a word line and a source select line) of the local lines LL in response to the row decoder control signals AD_signals.

The page buffer group 230 may include a plurality of page buffers (PB1 to PBn) 231 coupled to the bit lines BL1 to BLn. The page buffers (PB1 to PBn) 231 may operate in response to page buffer control signals PBSIGNALS. For example, the page buffers (PB1 to PBn) 231 may control the bit lines BL1 to BLn to be in a floating state during an erase voltage applying operation in an erase operation, and may sense current or potential levels of the bit lines BL1 to BLn during an erase verify operation.

The column decoder 240 may transfer data between the input/output circuit 250 and the page buffer group 230 in response to a column address CADD. For example, the column decoder 240 may exchange data with page buffers 231 through data lines DL, or may exchange data with the input/output circuit 250 through column lines CL.

The input/output circuit 250 may transfer a command CMD and an address ADD from the memory controller 1200 as shown in FIG. 1 to the control logic 300, or may exchange data DATA with the column decoder 240.

The pass/fail check circuit 260 may generate a reference current in response to an allowable bit VRY_BIT<#> and may compare a sensing voltage VPB received from the page buffer group 230 with a reference voltage generated by the reference current to output a pass signal PASS or a fail signal FAIL during a read operation or a verify operation.

The source line driver 270 may be coupled to the memory cells included in the memory cell array 100 through a source line SL and may control a voltage applied to a source line SL. For example, the source line driver 270 may sequentially generate and apply a pre-erase voltage, a first erase voltage, and a second erase voltage to the source line SL during an erase operation. The first erase operation may have a greater potential level than the pre-erase voltage and the second erase voltage may have a greater potential level than the first erase voltage.

The source line driver 270 may receive a source line control signal CTRL_SL from the control logic 300 and control a source line voltage applied to the source line SL on the basis of the source line control signal CTRL_SL.

The control logic 300 may control the peripheral circuits 200 by outputting the operation signal OP_CMD, the row decoder control signals AD_signals, the page buffer control signals PBSIGNALS, and the allowable bit VRY_BIT<#> in response to the command CMD and the address ADD. Further, the control logic 300 may determine whether a verify operation has passed or failed in response to the pass signal PASS or the fail signal FAIL.

Figure 3:
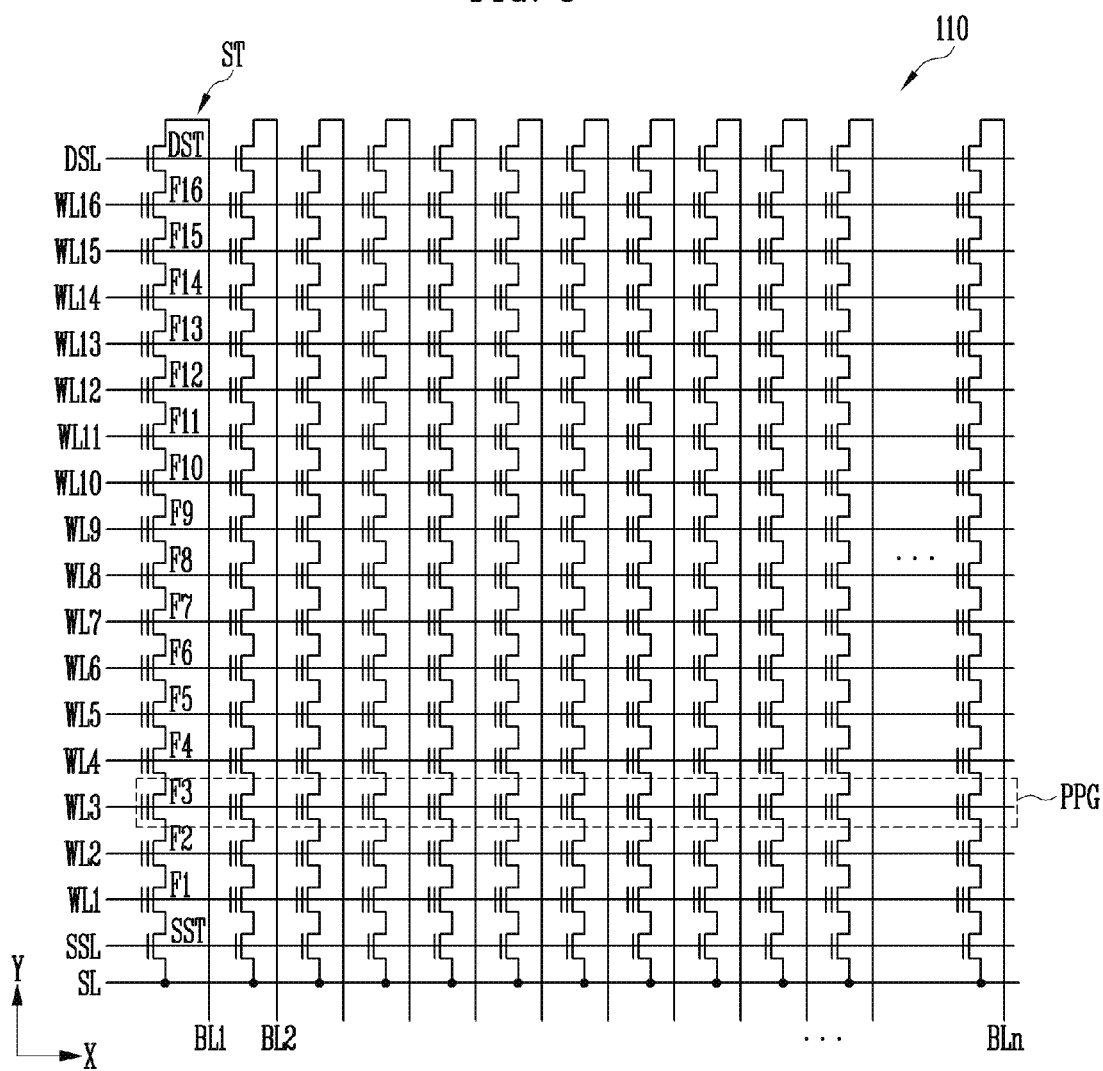
FIG. 3 is a diagram illustrating a memory block of FIG. 2.

FIG. 3 is a diagram illustrating the memory block 110 shown in FIG. 2.

Referring to FIG. 3, in the memory block 110, a plurality of word lines arranged in parallel with each other may be coupled between a first select line and a second select line. The first select line may be a source select line SSL and the second select line may be a drain select line DSL. More specifically, the memory block 110 may include a plurality of strings ST coupled between the bit lines BL1 to BLn and the source line SL. Each of the bit lines BL1 to BLn may be coupled to each of the strings ST, and the source line SL may be commonly coupled to the strings ST. Because the strings ST may all have the same configuration, the string ST coupled to the first bit line BL1 is described in detail by way of example.

The string ST may include a source select transistor SST, a plurality of memory cells F1 to F16, and a drain select transistor DST which are coupled in series between the source line SL and the first bit line BL1. A single string ST may include at least one source select transistor SST, at least one drain select transistor DST, and more memory cells than the memory cells F1 to F16 as shown in FIG. 4.

A source of the source select transistor SST may be coupled to the source line SL, and a drain of the drain select transistor DST may be coupled to the first bit line BL1. The memory cells F1 to F16 may be coupled in series between the source select transistor SST and the drain select transistor DST. Gates of the source select transistors SST included in different strings ST may be coupled to the source select line SSL, gates of the drain select transistors DST may be coupled to the drain select line DSL, and gates of the memory cells F1 to F16 may be coupled to a plurality of word lines WL1 to WL16. A group of memory cells coupled to the same word line, among memory cells included in different strings ST, may be referred to as a physical page PPG. Therefore, the memory block 110 may include as many physical pages PPG as the number of word lines WL1 to WL16.

A single memory cell may store one bit of data. This memory cell is generally called a single-level cell (SLC). One physical page PPG including SLCs may store data corresponding to one logical page LPG. Data corresponding to one logical page LPG may include as many data bits as the number of memory cells included in the physical page PPG. In addition, a single memory cell may store two or more bits of data. This cell is typically referred to as a "multi-level cell (MLC)". One physical page PPG including MLCs may store data corresponding to two or more logical pages LPG.

Figure 4:
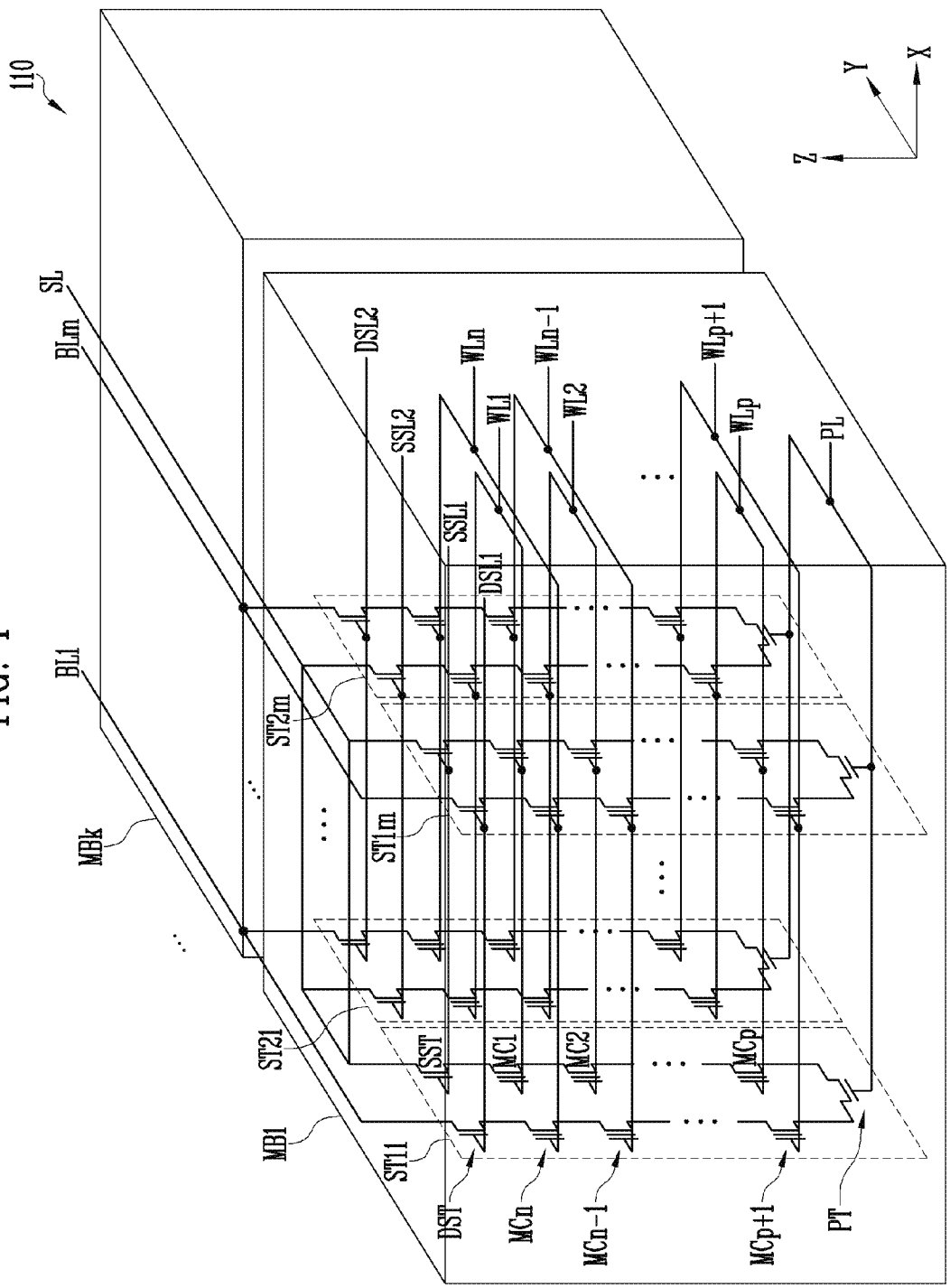
FIG. 4 is a diagram illustrating an embodiment of a three-dimensionally structured memory block.

FIG. 4 is a diagram illustrating an embodiment of a three-dimensionally structured memory block.

Referring to FIG. 4, the memory cell array 100 may include the plurality of memory blocks (MB1 to MBk) 110. The memory block 110 may include a plurality of strings ST11 to ST1m and ST21 to ST2m. According to an embodiment, each of the plurality of strings ST11 to ST1m and ST21 to ST2m may have a 'U' shape. In the first memory block MB1, 'm' strings may be arranged in a row direction (X direction). For convenience of explanation, FIG. 4 illustrates two strings arranged in a column direction (Y direction). However, three or more strings may be arranged in the column direction (Y direction).

Each of the plurality of strings ST11 to ST1m and ST21 to ST2m may include at least one source select transistor SST, first to nth memory cells MC1 to MCn, a pipe transistor PT, and at least one drain select transistor DST.

The source and drain select transistors SST and DST and the memory cells MC1 to MCn may have similar structures to each other. For example, each of the source and drain select transistors SST and DST and the memory cells MC1 to MCn may include a channel layer, a tunnel insulating layer, a charge trap layer, and a blocking insulating layer. For example, a pillar for providing a channel layer may be provided in each string. For example, a pillar for providing at least one of the channel layer, the tunnel insulating layer, the charge trap layer, and the blocking insulating layer may be provided in each string.

The source select transistor SST of each string may be coupled between the source line SL and the memory cells MC1 to MCp.

In an embodiment, source select transistors of strings arranged in the same row may be coupled to a source select line extending in the row direction, and source select transistors of strings arranged in different rows may be coupled to different source select lines. As shown in FIG. 4, the source select transistors SST of the strings ST11 to ST1m in the first row may be coupled to a first source select line SSL1. The source select transistors SST of the strings ST21 to ST2m arranged in the second row may be coupled to a second source select line SSL2.

According to another embodiment, the source select transistors SST of the strings ST11 to ST1m and ST21 to ST2m may be commonly coupled to one source select line.

The first to nth memory cells MC1 to MCn of each string may be coupled between the source select transistor SST and the drain select transistor DST.

The first to nth memory cells MC1 to MCn may be divided into the first to pth memory cells MC1 to MCp and (p+1)th to nth memory cells MCp+1 to MCn. The first to pth memory cells MC1 to MCp may be sequentially arranged in a vertical direction (Z direction) and be coupled in series between the source select transistor SST and the pipe transistor PT. The (p+1)th to nth memory cells MCp+1 to MCn may be sequentially arranged in the vertical direction (Z direction) and be coupled in series between the pipe transistor PT and the drain select transistor DST. The first to pth memory cells MC1 to MCp and the (p+1)th to nth memory cells MCp+1 to MCn may be coupled to each other through the pipe transistor PT. Gates of the first to nth memory cells MC1 to MCn of each string may be coupled to first to nth word lines WL1 to WLn, respectively.

According to an embodiment, at least one of the first to nth memory cells MC1 to MCn may serve as a dummy memory cell. When a dummy memory cell is provided, a voltage or current of the corresponding string may be stably controlled. A gate of the pipe transistor PT of each string may be coupled to a pipe line PL.

The drain select transistor DST of each string may be coupled between the corresponding bit line and the memory cells MCp+1 to MCn. Strings arranged in the row direction may be coupled to a drain select line extending in the row direction. The drain select transistors DST of the strings ST11 to ST1m in the first row may be coupled to a first drain select line DSL1. Drain select transistors of the strings ST21 to ST2m in the second row may be coupled to a second drain select line DSL2.

Strings arranged in a column direction may be coupled to bit lines extending in the column direction. As illustrated in FIG. 4, the strings ST11 and ST21 in the first column may be coupled to the first bit line BL1. The strings ST1m and ST2m in the mth column may be coupled to the mth bit line BLm.

Memory cells coupled to the same word line, among strings arranged in the row direction, may form a single page. For example, memory cells coupled to the first word line WL1, among the strings ST11 to ST1m in the first row, may constitute one page. Among the strings ST21 to ST2m in the second row, memory cells coupled to the first word line WL1 may constitute one additional page. When one of the drain select lines DSL1 and DSL2 is selected, strings arranged in one row direction may be selected. One page may be selected from among the selected strings when any one of the word lines WL1 to WLn is selected.

Figure 5:
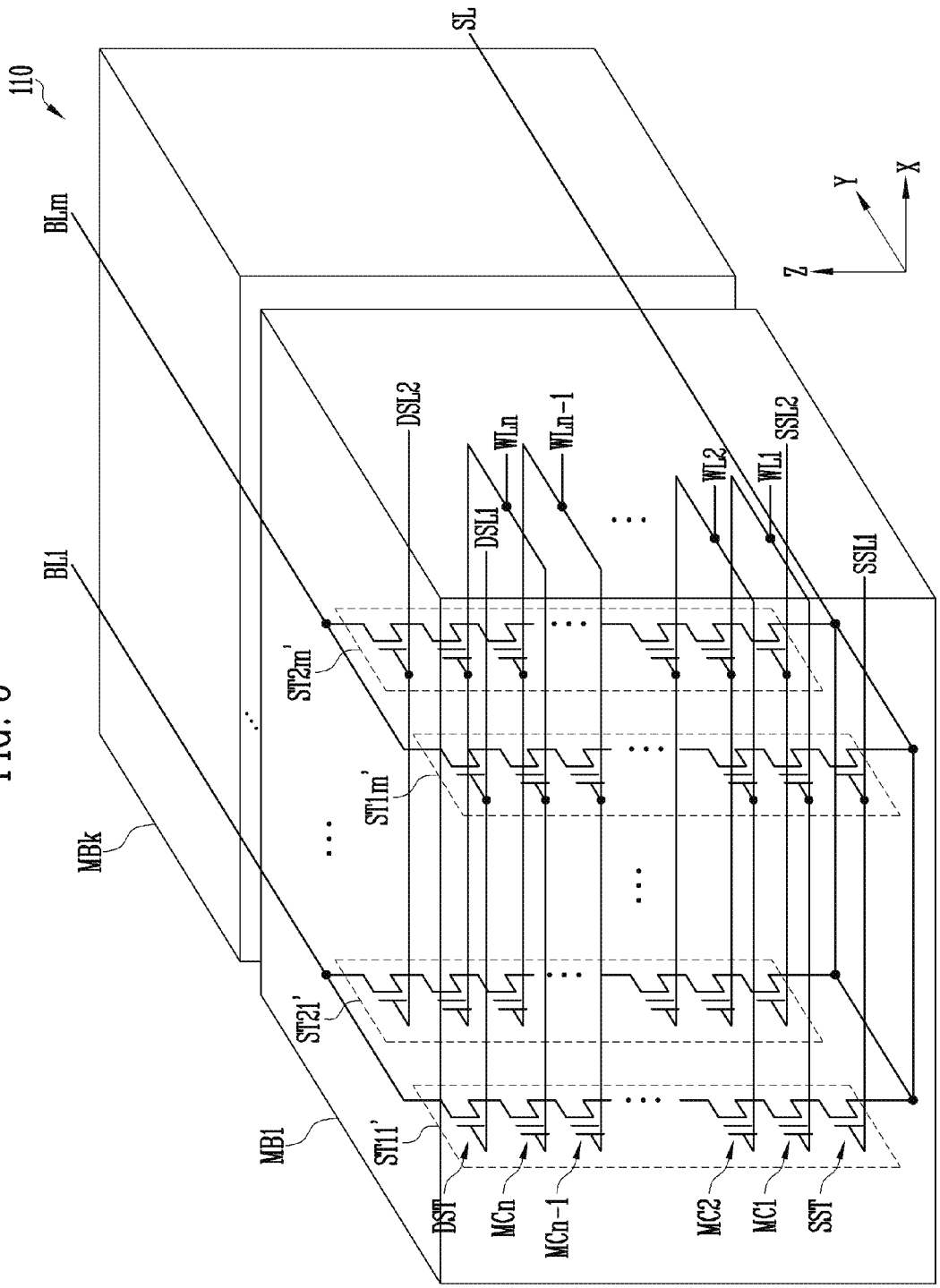
FIG. 5 is a diagram illustrating another embodiment of a three-dimensionally structured memory block.

FIG. 5 is a diagram illustrating another embodiment of a three-dimensionally structured memory block.

Referring to FIG. 5, the memory cell array 100 may include the plurality of memory blocks (MB1 to MBk) 110. The memory block 110 may include a plurality of strings ST11' to ST1m' and ST21' to ST2m'. Each of the plurality of strings ST11' to ST1m' and ST21' to ST2m' may extend in a vertical direction (Z direction). In the memory block 110, 'm' strings may be arranged in a row direction (X direction). FIG. 5 illustrates two strings arranged in a column direction (e.g., Y direction). However, this embodiment is given for convenience of description, and three or more strings may be arranged in the column direction (e.g., Y direction) in other embodiments.

Each of the plurality of strings ST11' to ST1m' and ST21' to ST2m' may include at least one source select transistor SST, first to nth memory cells MC1 to MCn, and at least one drain select transistor DST.

The source select transistor SST of each string may be coupled between the source line SL and the memory cells MC1 to MCn. Source select transistors of strings arranged in the same row may be coupled to the same source select line. The source select transistors SST of the strings ST11' to ST1m' arranged in the first row may be coupled to the first source select line SSL1. The source select transistors of the strings ST21' to ST2m' arranged in the second row may be coupled to the second source select line SSL2. According to another embodiment, the source select transistors SST of the strings ST11' to ST1m' and ST21' to ST2m' may be commonly coupled to a single source select line.

The first to nth memory cells MC1 to MCn of each string may be coupled in series between the source select transistor SST and the drain select transistor DST. Gates of the first to nth memory cells MC1 to MCn may be coupled to the first to nth word lines WL1 to WLn, respectively.

According to an embodiment, at least one of the first to nth memory cells MC1 to MCn may serve as a dummy memory cell. When a dummy memory cell is provided, a voltage or current of the corresponding string may be stably controlled. As a result, the reliability of data stored in the memory block 110 may be improved.

The drain select transistor DST of each string may be coupled between the corresponding bit line and the memory cells MC1 to MCn. The drain select transistors DST of strings arranged in the row direction may be coupled to a drain select line extending in the row direction. The drain select transistors DST of strings CS11' to CS1m' in the first row may be coupled to the first drain select line DSL1. The drain select transistors DST of strings CS21' to CS2m' in the second row may be coupled to the second drain select line DSL2.

Figure 6:
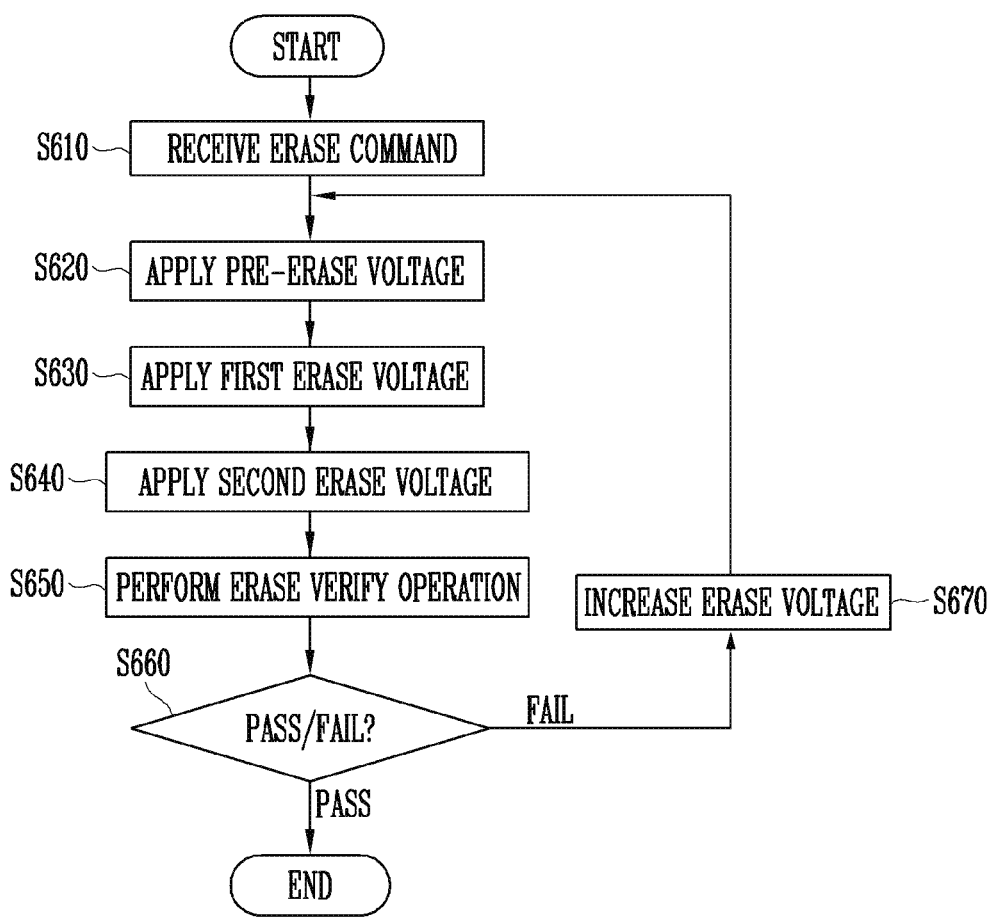
FIG. 6 is a flowchart illustrating a method of performing an erase operation on a memory device according to an embodiment of the present disclosure.

FIG. 6 is a flowchart illustrating a method of performing an erase operation on a memory device according to an embodiment of the present disclosure.

Figure 7:
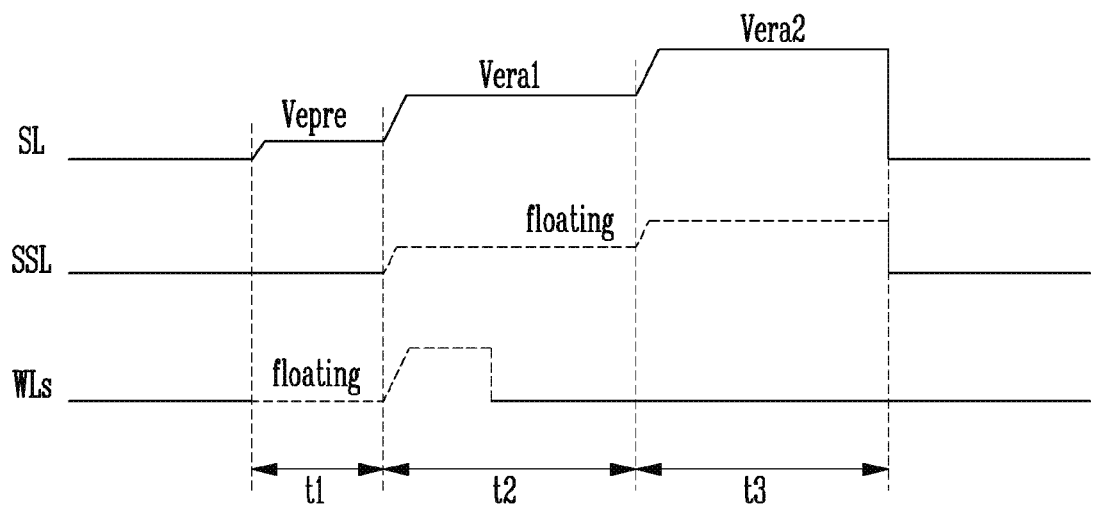
FIG. 7 is a waveform diagram of signals for illustrating an erase operation of a memory device according to an embodiment of the present disclosure.

FIG. 7 is a waveform view of signals for illustrating an erase operation of a memory device according to an embodiment of the present disclosure.

An erase operation of a memory device according to an embodiment of the present disclosure is described below with reference to FIGS. 1 to 7.

When an erase command is received from the host 2000 (S610), the memory controller 1200 may generate the command CMD corresponding to the received erase command and the address ADD corresponding to a memory block (e.g., MB1) on which an erase operation is performed, among a plurality of memory blocks MB1 to MBk included in the memory device 1100, and may output the command CMD and the address ADD to the memory device 1100.

The control logic 300 of the memory device 1100 may control peripheral circuits 200 to perform an erase operation on the selected memory block MB1 in response to the command CMD and the address ADD received through the input/output circuit 250.

The source line driver 270 may generate a pre-erase voltage Vepre and apply the pre-erase voltage Vepre to the source line SL coupled to the selected memory block MB1 in response to the source line control signal CTRL_SL during a time interval t1 (S620).

During the time interval t1, the page buffers (PB1 to PBn) 231 of the page buffer group 230 may control the bit lines BL1 to BLn to be in a floating state, and the row decoder 220 may control the source select line SSL to be at a ground voltage level.

A gate induced drain leakage (GIDL) current may be formed in a channel under the source select transistor SST by the pre-erase voltage Vepre applied to the source line SL. In other words, hot holes may be generated in a drain region of the source select transistor SST. Word lines WLs may be controlled to be in a floating state.

After a predetermined time has passed since the pre-erase voltage Vepre was applied, the source line driver 270 may generate a first erase voltage Vera1 greater than the pre-erase voltage Vepre and apply the generated first erase voltage Vera1 to the source line SL coupled to the selected memory block MB1 in response to the source line control signal CTRL_SL during a time interval t2 (S630). As a result, a channel potential level of the selected memory block MB1 may be further increased. During a time interval t3, the row decoder 220 may float the source select line SSL in response to the row decoder control signals AD_signals.

The row decoder 220 may control word lines WLs from the floating state to a ground voltage level. Electrons stored in charge storage layers of memory cells in a program state, among the plurality of memory cells MC1 to MCn included in the selected memory block MB1, may be detrapped by a high potential level of the channel and a ground potential level of the word lines WLs. The above-described method of erasing the memory cells using the gate induced drain leakage (GIDL) current may be defined as a GIDL erase method. By this GIDL erase method, a threshold voltage distribution of the memory cells in the program state, among the memory cells MC1 to MCn, may shift to the left, as indicated by arrows in FIG. 8, so that the memory cells MC1 to MCn may be in a preliminary erase state. The threshold voltage distribution of the memory cells in the preliminary erase state may be controlled by controlling a potential level of the first erase voltage Vera1 so that threshold voltages of the memory cells in the preliminary erase state may have a greater voltage level than a target threshold voltage. For example, by performing an erase operation by applying the first erase voltage Vera1 to the source line SL of the selected memory block MB1, memory cells programmed to program states having greater threshold voltage distributions, among a plurality of program states, may be primarily erased to have program states having lower threshold voltage distributions, so that the memory cells may be in a preliminary erase state.

The source line driver 270 may generate a second erase voltage Vera2 greater than the first erase voltage Vera1 and apply the generated second erase voltage Vera2 to the source line SL coupled to the selected memory block MB1 in response to the source line control signal CTRL_SL during the time interval t3 (S640). Thus, the channel potential level of the selected memory block MB1 may be further increased, and the threshold voltage distribution of the memory cells in the preliminary erase state may further shift to the left by the GIDL erase method, so that the memory cells may be secondarily erased to have threshold voltages less than or equal to the target erase threshold voltage.

Subsequently, an erase verify operation may be performed (S650) to check whether threshold voltages of the memory cells MC1 to MCn included in the selected memory block MB1 are smaller than or equal to the target erase threshold voltage.

When, as a result of the erase verify operation (S660), threshold voltages of all memory cells or a first predetermined number or more of memory cells are less than or equal to the target erase threshold voltage, a pass may be determined. When threshold voltages of a second predetermined number or more of memory cells are greater than the target erase threshold voltage, a fail may be determined.

When the result of the erase verify operation (S660) is determined as a pass, the erase operation may end. When the result of the erase verify operation (S660) is determined as a fail, both first and second erase voltages Vera1 and Vera2, or the second erase voltage Vera2 may be increased, and the erase operation may restart from the above-described pre-erase voltage applying operation (S620). According to another embodiment, when the result of the above-described erase verify operation (S660) is determined as a fail, the second erase voltage Vera2 may be increased and the erase operation may start from the second erase voltage applying operation (S640).

Figure 8:
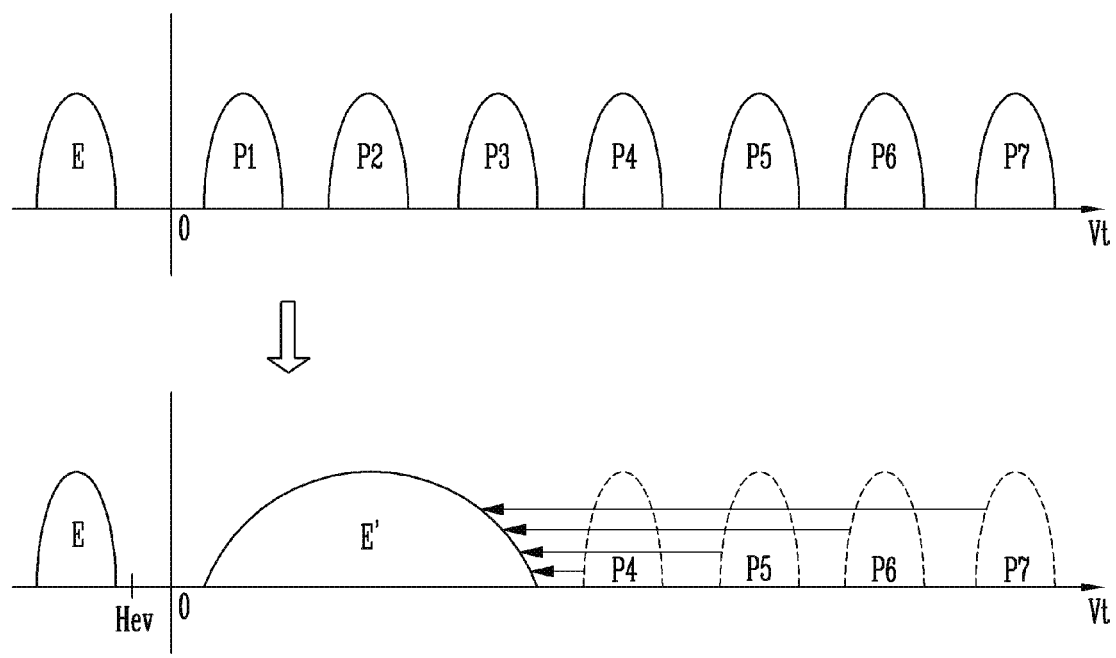
FIG. 8 is a threshold voltage distribution chart illustrating a first erase voltage application operation in an erase operation of a memory device according to an embodiment of the present disclosure.

FIG. 8 is a threshold voltage distribution chart illustrating a first erase voltage applying operation in an erase operation of a memory device according to an embodiment of the present disclosure.

Figure 9:
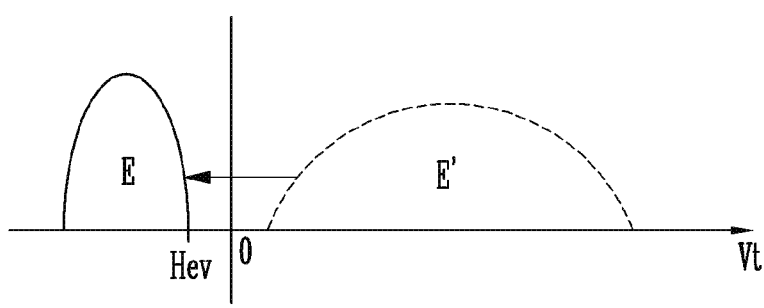
FIG. 9 is a threshold voltage distribution chart illustrating a second erase voltage application operation in an erase operation of a memory device according to an embodiment of the present disclosure.

FIG. 9 is a threshold voltage distribution chart illustrating a second erase voltage applying operation in an erase operation of a memory device according to an embodiment of the present disclosure.

Referring to FIGS. 8 and 9, threshold voltage Vt is shown on the horizontal axis. During an erase operation of a memory block including memory cells programmed to an erase state E and a plurality of program states P1 to P7, the memory cells programmed to the plurality of program states P1 to P7 may be primarily erased to have a preliminary erase state E' by performing an erase operation using a first erase voltage. The preliminary erase state E' may have a greater threshold voltage distribution than a target erase voltage Hey.

During a first erase voltage applying operation, threshold voltage distributions of memory cells having higher program states (e.g., P4 to P7), among the memory cells programmed to the plurality of program states P1 to P7, may shift to the left, so that the memory cells may have the preliminary erase state E' as shown in FIG. 8.

When a second erase voltage applying operation is performed as shown in FIG. 9, the threshold voltage distribution of the memory cells having the preliminary erase state E' may shift to the erase state E, so that the memory cells may be fully erased. The erase state E may be less than or equal to the target erase voltage Hey.

As described above, according to an embodiment of the present disclosure, memory cells in a program state having greater threshold voltage distributions may shift to the left by using a first erase voltage having a lower voltage level to erase the memory cells to have a preliminary erase state, and the memory cells in the preliminary erase state may be erased to have an erase state less than or equal to a target erase voltage by using a second erase voltage having a greater voltage level.

By erasing the memory cells from the preliminary erase state to the erase state, the potential level of the second erase voltage applied during an erase operation may be reduced, and stress applied to the memory cells caused by the erase voltage may be reduced.

In addition, as compared to when memory cells are directly erased to have an erase state from a plurality of program states, an erase operation may be finally performed in a preliminary erase state having a smaller threshold voltage distribution width than the entire threshold voltage distribution width of the plurality of program states, so that a threshold voltage distribution width of the erase state may be improved.

Figure 10:
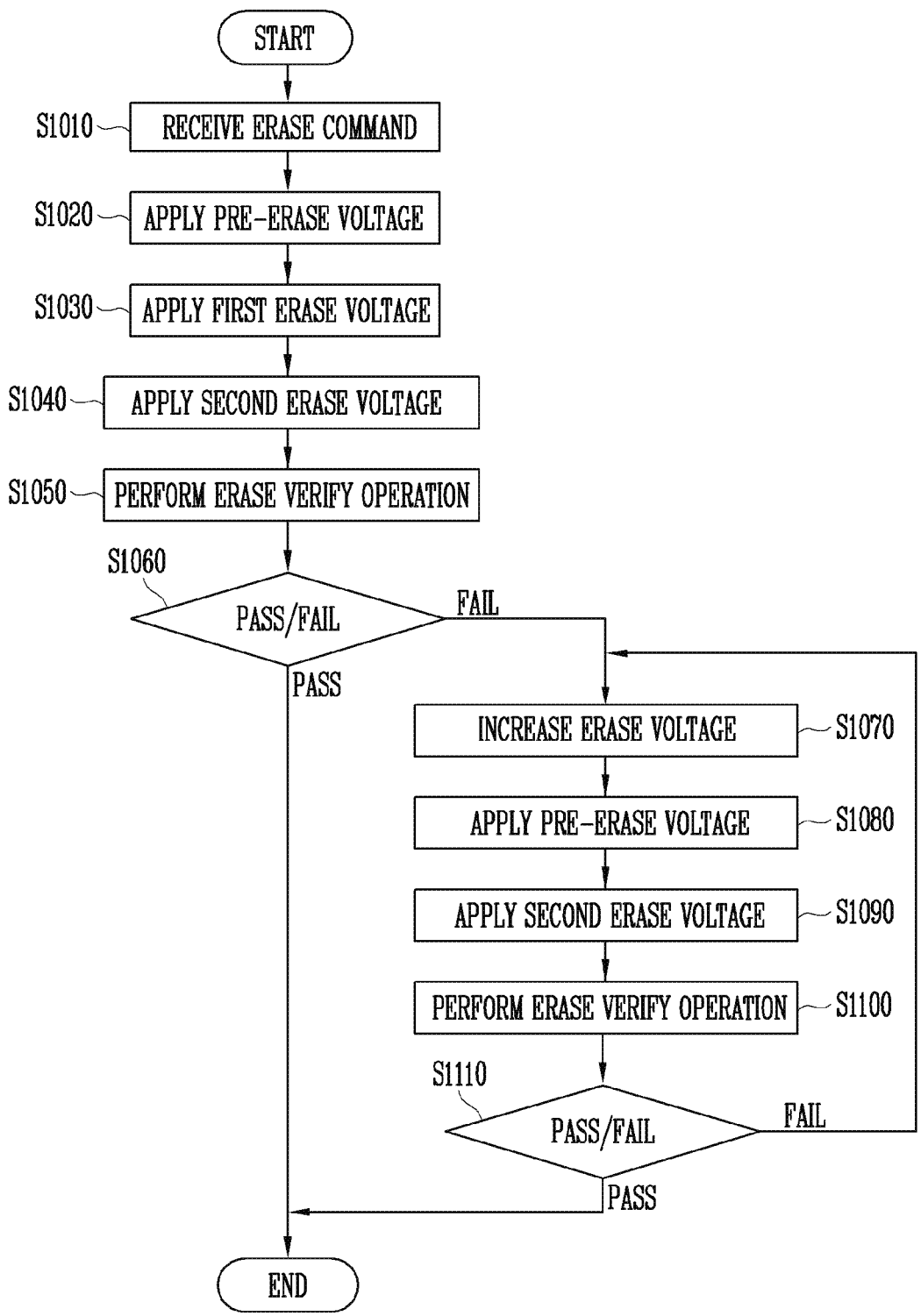
FIG. 10 is a diagram illustrating a method of performing an erase operation on a memory device according to another embodiment of the present disclosure.

FIG. 10 is a flowchart illustrating a method of performing an erase operation on the memory device 1100 according to an embodiment of the present disclosure.

An erase operation of the memory device 1100 according to an embodiment of the present disclosure is described below with reference to FIGS. 1 to 5, 7, and 10.

When an erase command is received from the host 2000 (S1010), the memory controller 1200 may generate the command CMD corresponding to the received erase command CMD and the address ADD corresponding to a memory block (e.g., MB1) on which an erase operation is performed, among the plurality of memory blocks MB1 to MBk included in the memory device 1100, and may output the command CMD and the address ADD to the memory device 1100.

The control logic 300 of the memory device 1100 may control the peripheral circuits 200 to perform the erase operation on the selected memory block MB1 in response to the command CMD and the address ADD received through the input/output circuit 250.

The source line driver 270 may generate the pre-erase voltage Vepre and apply the pre-erase voltage Vepre to the source line SL coupled to the selected memory block MB1 in response to the source line control signal CTRL_SL during the time interval t1 (S1020).

During the time interval t1, the page buffers (PB1 to PBn) 231 of the page buffer group 230 may control the bit lines BL1 to BLn to be in a floating state, and the row decoder 220 may control the source select line SSL to be at a ground voltage level.

A gate induced drain leakage (GIDL) current may be formed in a channel under the source select transistor SST by the pre-erase voltage Vepre applied to the source line SL. In other words, hot holes may be generated in a drain region of the source select transistor SST. The word lines WLs may be controlled to be in a floating state.

After a predetermined time has passed since the pre-erase voltage Vepre was applied, the source line driver 270 may generate the first erase voltage Vera1 greater than the pre-erase voltage Vepre and apply the generated first erase voltage Vera1 to the source line SL coupled to the selected memory block MB1 in response to the source line control signal CTRL_SL during the time interval t2 (S1030). As a result, a channel potential level of the selected memory block MB1 may be further increased. During the time interval t3, the row decoder 220 may float the source select line SSL in response to the row decoder control signals AD_signals.

The row decoder 220 may control the word lines WLs in the floating state to be in a ground voltage level. Electrons stored in charge storage layers of memory cells in a program state, among the plurality of memory cells MC1 to MCn included in the selected memory block MB1, may be detrapped by a high potential level of the channel and a ground potential level of the word lines WLs. By a GIDL erase method, a threshold voltage distribution of the memory cells in the program state, among the memory cells MC1 to MCn, may shift to the left, so that the memory cells MC1 to MCn may be in a preliminary erase state. By controlling the potential level of the first erase voltage, the threshold voltage distribution of the memory cells in the preliminary erase state may be controlled so that threshold voltages of the memory cells may have a greater voltage level than a target threshold voltage. For example, by performing an erase operation by applying the first erase voltage Vera1 to the source line SL of the selected memory block MB1, memory cells programmed to program states having greater threshold voltage distributions, among the plurality of program states, may be primarily erased to have program states having lower threshold voltage distributions so that the memory cells may be in a preliminary erase state.

The source line driver 270 may generate the second erase voltage Vera2 greater than the first erase voltage Vera1 and apply the generated second erase voltage Vera2 to the source line SL coupled to the selected memory block MB1 in response to the source line control signal CTRL_SL during the time interval t3 (S1040). Thus, the channel potential level of the selected memory block MB1 may be further increased, and the threshold voltage distribution of the memory cells in the preliminary erase state may shift further to the left by, the GIDL erase method, so that the memory cells may be secondarily erased to have threshold voltages less than or equal to the target erase threshold voltage.

Subsequently, an erase verify operation may be performed (S1050) to check whether threshold voltages of the memory cells MC1 to MCn included in the selected memory block MB1 are smaller than or equal to the target erase threshold voltage.

When, as a result of the erase verify operation (S1060), threshold voltages of all memory cells or a first predetermined number or more of memory cells are less than or equal to the target erase threshold voltage, a pass may be determined, and when threshold voltages of a second predetermined number or more of memory cells are greater than the target erase threshold voltage, a fail may be determined.

When the result of the erase verify operation (S1060) is determined as a pass, the erase operation may end. When the result of the erase verify operation (S1060) is determined as a fail, the second erase voltage Vera2 may be increased to re-set the second erase voltage Vera2.

Subsequently, the source line driver 270 may generate the pre-erase voltage Vepre and apply the generated pre-erase voltage Vepre to the source line SL coupled to the selected memory block MB1 (S1080).

After a predetermined time has passed since the pre-erase voltage Vepre was applied, the source line driver 270 may generate the newly set second erase voltage Vera2 and apply the generated second erase voltage Vera2 to the source line SL coupled to the selected memory block MB1 in response to the source line control signal CTRL_SL (S1090). As a result, the channel potential level of the selected memory block MB1 may be increased by the second erase voltage Vera2. The row decoder 220 may control the source select line SSL from the floating state to the ground voltage level in response to the row decoder control signals AD_signals. Electrons stored in charge storage layers of memory cells in a program state, among the plurality of memory cells MC1 to MCn included in the selected memory block MB1, may be detrapped and erased by a high potential level of the channel and a ground potential level of the word lines WLs.

Subsequently, an erase verify operation may be performed (S1100) to check whether threshold voltages of the memory cells MC1 to MCn included in the selected memory block MB1 are smaller than or equal to the target erase threshold voltage.

When, as a result of the erase verify operation (S1110), threshold voltages of all memory cells or a first predetermined number or more of memory cells are less than or equal to the target erase threshold voltage, a pass may be determined, and the erase operation may end. When threshold voltages of a second predetermined number or more of memory cells are greater than the target erase threshold voltage, a fail may be determined, and the erase operation may restart from the erase voltage increasing operation (S1070).

As described above, according to another embodiment of the present disclosure, when an erase voltage is applied according to an increment step pulse erase (ISPE) method, a first erase voltage applying operation and a second erase voltage applying operation may be sequentially performed in a first erase loop, and in a subsequent erase loop, the first erase voltage applying operation may be skipped, and the second erase voltage applying operation may be performed. As a result, during the erase operation using the ISPE method, an erase operation time may be improved because the first erase voltage applying operation is skipped in an erase loop subsequent to the first erase loop.

Figure 11:
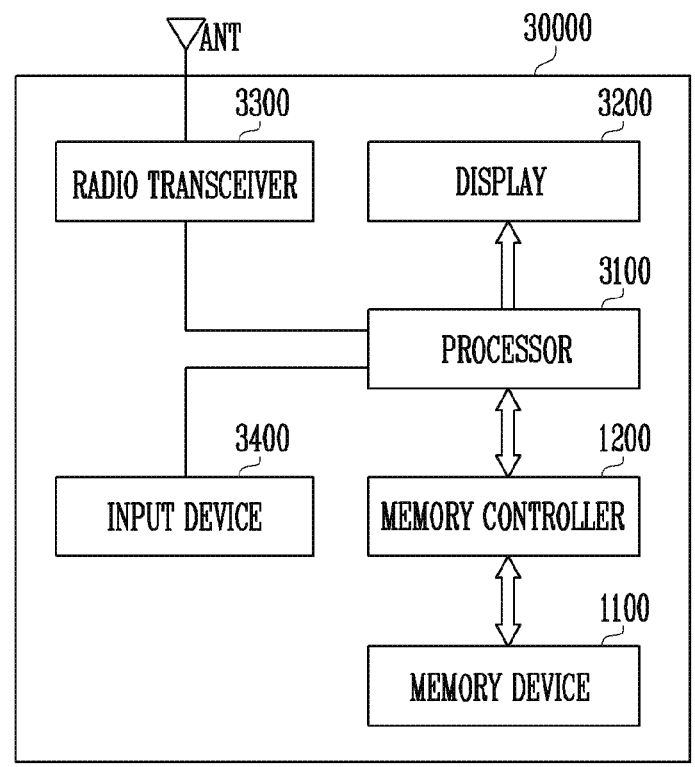
FIG. 11 is a diagram illustrating another embodiment of a memory system.

FIG. 11 is a diagram illustrating another embodiment of a memory system.

Referring to FIG. 11, a memory system 30000 may be embodied in a cellular phone, a smartphone, a tablet PC, a personal digital assistant (PDA), or a wireless communication device. The memory system 30000 may include the memory device 1100 and the memory controller 1200 controlling the operations of the memory device 1100. The memory controller 1200 may control a data access operation of the memory device 1100, for example, a program operation, an erase operation, or a read operation in response to control of a processor 3100.

The memory controller 1200 may control data programmed into the memory device 1100 to be output through a display 3200 in response to control of the memory controller 1200.

A radio transceiver 3300 may exchange a radio signal through an antenna ANT. For example, the radio transceiver 3300 may change the radio signal received through the antenna ANT into a signal which can be processed by the processor 3100. Therefore, the processor 3100 may process the signal output from the radio transceiver 3300 and transfer the processed signal to the memory controller 1200 or the display 3200. The memory controller 1200 may program the signal processed by the processor 3100 into the memory device 1100. In addition, the radio transceiver 3300 may change a signal output from the processor 3100 into a radio signal and output the radio signal to an external device through the antenna ANT. A control signal for controlling the operations of the processor 3100 or data to be processed by the processor 3100 may be input by the input device 3400, and the input device 3400 may include a pointing device, such as a touch pad and a computer mouse, a keypad, or a keyboard. The processor 3100 may control operations of the display 3200 so that the data output from the memory controller 1200, the data output from the radio transceiver 3300, or the data output from the input device 3400 may be displayed on the display 3200.

According to an embodiment, the memory controller 1200 controlling the operations of the memory device 1100 may form part of the processor 3100, or be formed as a separate chip from the processor 3100. The memory device 1100 may be realized through the example embodiment of the memory device 1100 as shown in FIG. 2.

Figure 12:
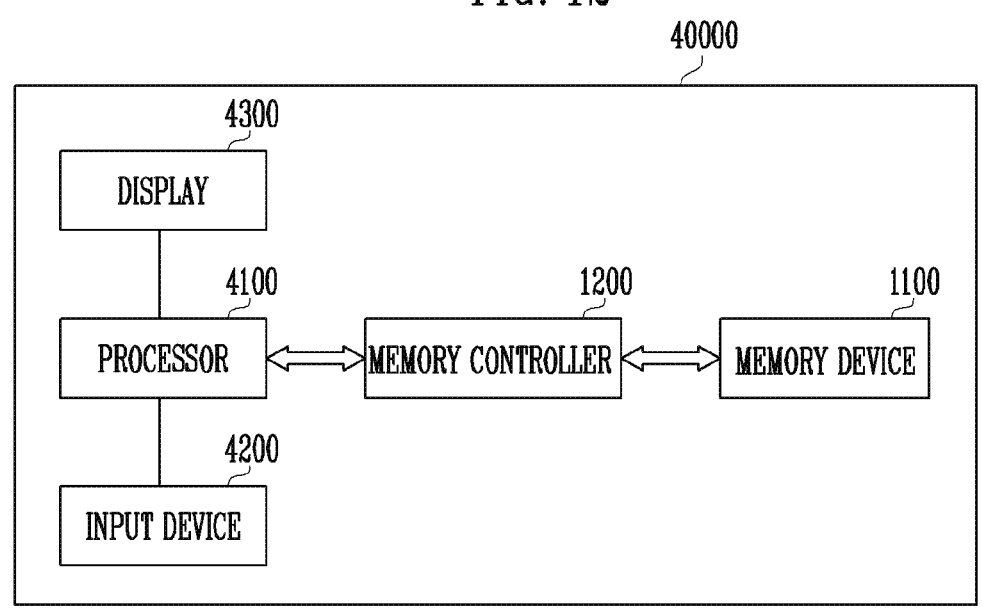
FIG. 12 is a diagram illustrating another embodiment of a memory system.

FIG. 12 is a diagram illustrating another embodiment of a memory system.

Referring to FIG. 12, a memory system 40000 may be provided as a personal computer (PC), a tablet PC, a net-book, an e-reader, a personal digital assistant (PDA), a portable multimedia player (PMP), an MP3 player, or an MP4 player.

The memory system 40000 may include the memory device 1100 and the memory controller 1200 controlling a data processing operation of the memory device 1100.

A processor 4100 may output data stored in the memory device 1100 through a display 4300 according to data input through an input device 4200. Examples of the input device 4200 may include a pointing device such as a touch pad or a computer mouse, a keypad, or a keyboard.

The processor 4100 may control the general operations of the memory system 40000 and control the operations of the memory controller 1200. According to an embodiment, the memory controller 1200 capable of controlling the operations of the memory device 1100 may form a portion of the processor 4100, or may be formed as a separate chip from the processor 4100. The memory device 1100 may be realized through the example embodiment of the memory device 1100 as shown in FIG. 2.

Figure 13:
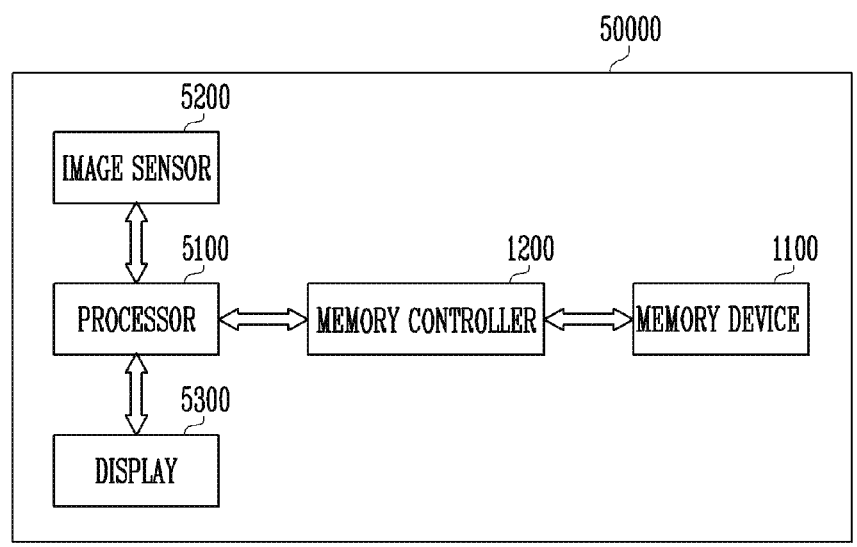
FIG. 13 is a diagram illustrating another embodiment of a memory system.

FIG. 13 is a diagram illustrating another embodiment of a memory system.

Referring to FIG. 13, a memory system 50000 may be provided as an image processing device, for example, a digital camera, a mobile phone equipped with a digital camera, a smart phone equipped with a digital camera, or a tablet PC equipped with a digital camera.

The memory system 50000 may include the memory device 1100 and the memory controller 1200 controlling a data processing operation of the memory device 1100, for example, a program operation, an erase operation, or a read operation.

An image sensor 5200 of the memory system 50000 may convert an optical image into digital signals, and the digital signals may be transferred to a processor 5100 or the memory controller 1200. The processor 5100 may control the digital signals to be output through a display 5300, or to be stored in the memory device 1100 through the memory controller 1200. In addition, the data stored in the memory device 1100 may be output through the display 5300 according to control of the processor 5100 or the memory controller 1200.

According to an embodiment, the memory controller 1200 capable of controlling the operations of the memory device 1100 may form a portion of the processor 5100, or may be formed as a separate chip from the processor 5100. The memory device 1100 may be realized through the example embodiment of the memory device 1100 as shown in FIG. 2.

Figure 14:
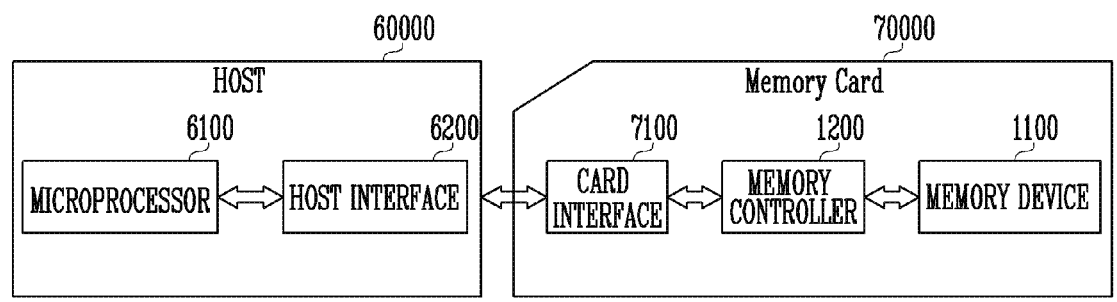
FIG. 14 is a diagram illustrating another embodiment of a memory system.

FIG. 14 is a diagram illustrating another embodiment of a memory system.

Referring to FIG. 14, a memory system 70000 may be embodied in the form of a memory card or a smart card. The memory system 70000 may include the memory device 1100, the memory controller 1200, and a card interface 7100.

The memory controller 1200 may control data exchange between the memory device 1100 and the card interface 7100. According to an embodiment, the card interface 7100 may be, but not limited thereto, a secure digital (SD) card interface or a multi-media card (MMC) interface. The memory controller 1200 may be realized through the example embodiment of the memory controller 1200 as shown in FIG. 2.

The card interface 7100 may interface data exchange between a host 60000 and the memory controller 1200 according to a protocol of the host 60000. According to an embodiment, the card interface 7100 may support a Universal Serial Bus (USB) protocol and an InterChip (IC)-USB protocol. The card interface may refer to hardware capable of supporting a protocol which is used by the host 60000, software installed in the hardware, or a signal transmission method.

When the memory system 70000 is connected to a host interface 6200 of the host 60000 such as a PC, a tablet PC, a digital camera, a digital audio player, a cellular phone, console video game hardware or a digital set-top box, the host interface 6200 may perform data communication with the memory device 1100 through the card interface 7100 and the memory controller 1200 under the control of a microprocessor 6100. The memory device 1100 may be realized through the example embodiment of the memory device 1100 as shown in FIG. 2.

According to the present disclosure, during an erase operation, threshold voltages of memory cells in a program state may be reduced to a pre-erase state greater than a target erase threshold voltage level by using a first erase voltage, and threshold voltages of the memory cells in the pre-erase state may be erased to have a level less than the target erase threshold voltage level, so that erase stress of the memory cells may be reduced and an erase threshold voltage distribution may be improved.

It will be apparent to those skilled in the art that various modifications can be made to any of the above-described embodiments of the present teachings without departing from the spirit or scope of the teachings. Thus, it is intended that the present teachings cover all such modifications provided they come within the scope of the appended claims and their equivalents.

It should be understood that many variations and modifications of the embodiments described herein will still fall within the spirit and scope of the present disclosure as defined in the accompanying claims and equivalents thereof.

Thus, it is intended that the present teachings cover all such modifications provided they come within the scope of the appended claims and their equivalents.

In the above-discussed embodiments, all steps may be selectively performed or skipped. In addition, the steps in each embodiment might not always be performed in the presented order. Furthermore, the embodiments disclosed in the present specification and the drawings aims to help those with ordinary knowledge in this art more clearly understand the present disclosure rather than aiming to limit the bounds of the present disclosure. In other words, one of ordinary skill in the art to which the present disclosure belongs will be able to easily understand that various modifications are possible based on the technical scope of the present disclosure.

Embodiments of the present disclosure have been described with reference to the accompanying drawings, and specific terms or words used in the description should be construed in accordance with the spirit of the present disclosure without limiting the subject matter thereof. It should be understood that many variations and modifications of the present teachings described herein will still fall within the spirit and scope of the present disclosure as defined in the accompanying claims and equivalents thereof.

What is claimed is:

1. A memory device, comprising:
   a memory cell block including a plurality of memory cells;
   peripheral circuits configured to perform an erase operation by a gate induce drain leakage (GIDL) method by applying a pre-erase voltage, a first erase voltage and a second erase voltage to a source line of the memory cell block; and
   control logic configured to control the peripheral circuits to sequentially perform an operation of applying the first erase voltage and an operation of applying the second erase voltage during the erase operation,
   wherein memory cells having a plurality of program states, among the plurality of memory cells, are erased to have a pre-erase state during the operation of applying the first erase voltage, and
   wherein a potential level of the pre-erase voltage is lower than a potential level of the first erase voltage, and the potential level of the first erase voltage is lower than a potential level of the second erase voltage.

2. The memory device of claim 1, wherein the memory cells erased to have the pre-erase state are erased to a target erase level or less during the operation of applying the second erase voltage.

3. The memory device of claim 2, wherein the pre-erase state has a greater threshold voltage distribution than the target erase level.

4. The memory device of claim 1, wherein the control logic is configured to control the peripheral circuits to perform the operation of applying the first erase voltage so that threshold voltage distributions of program states which are greater than those of other program states, among the plurality of program states, shift toward lower threshold voltages to erase the memory cells to have the pre-erase state.

5. The memory device of claim 1, wherein the peripheral circuits comprise:
a source line driver configured to sequentially apply the pre-erase voltage, the first erase voltage, and the second erase voltage to the source line;
a page buffer group coupled to bit lines of the memory cell block and configured to control the bit lines to be in a floating state during the erase operation; and
a row decoder coupled to local lines of the memory cell block, wherein the row decoder is configured to:
float a source select line, among the local lines, during the operation of applying the first erase voltage and during the operation of applying the second erase voltage; and
control word lines in a floating state, among the local lines, to be at a ground voltage level during the operation of applying the first erase voltage.

6. The memory device of claim 5, wherein the row decoder is configured to control the word lines to be in the floating state when the pre-erase voltage is applied to the source line.

7. The memory device of claim 1, wherein the control logic is configured to control the peripheral circuits to perform an erase verify operation after the erase operation, and
wherein the control logic is configured to control the peripheral circuits to increase the second erase voltage according to an increment step pulse erase (ISPE) method and to re-perform the operation of applying the second erase voltage when a result of the erase verify operation is determined as a fail.

8. A memory device, comprising:
a memory cell block including a plurality of memory cells programmed to a plurality of program states; and
peripheral circuits configured to perform an erase operation by a gate induce drain leakage (GIDL) method by applying a pre-erase voltage, a first erase voltage and a second erase voltage greater than the first erase voltage to a source line of the memory cell block, the erase operation including a first erase voltage applying operation and a second erase voltage applying operation,
wherein the peripheral circuits are configured to erase the plurality of memory cells to have a pre-erase state during the first erase voltage applying operation, and configured to erase the plurality of memory cells in the pre-erase state to a target erase voltage level or less during the second erase voltage applying operation, and
wherein a potential level of the pre-erase voltage is lower than a potential level of the first erase voltage.

9. The memory device of claim 8, wherein the control logic is configured to control the peripheral circuits to perform the first erase voltage applying operation so that threshold voltage distributions of program states which are greater than other program states, among the plurality of program states, shift toward lower threshold voltages to erase the memory cells to have the pre-erase state.

10. The memory device of claim 8, wherein the peripheral circuits comprise:
a source line driver configured to sequentially apply the pre-erase voltage, the first erase voltage, and the second erase voltage to the source line;
a page buffer group coupled to bit lines of the memory cell block and configured to control the bit lines to be in a floating state during the erase operation; and
a row decoder coupled to local lines of the memory cell block, wherein the row decoder is configured to:
float a source select line, among the local lines, during the first erase voltage applying operation and the second erase voltage applying operation; and
control word lines in a floating state, among the local lines, to be at a ground voltage level during the first erase voltage applying operation.

11. The memory device of claim 10, wherein the row decoder is configured to control the word lines to be in the floating state when the pre-erase voltage is applied to the source line.

12. A method of operating a memory device, the method comprising:
applying a pre-erase voltage to a source line of a memory cell block including a plurality of memory cells;
erasing the plurality of memory cells programmed to a plurality of program states to have a pre-erase state by applying a first erase voltage to the source line of the memory cell block; and
erasing the plurality of memory cells by a gate induce drain leakage (GIDL) method so that the plurality of memory cells have threshold voltages of a target erase voltage level or less by applying a second erase voltage to the source line after the application of the first erase voltage.

13. The method of claim 12, wherein the first erase voltage is less than the second erase voltage and the pre-erase state has a greater threshold voltage distribution than the target erase voltage level.

14. The method of claim 12, wherein erasing the plurality of memory cells to have the pre-erase state is performed when threshold voltage distributions of program states which are greater than those of other program states, among the plurality of program states, shift toward lower threshold voltages to erase the memory cells to have the pre-erase state.

15. The method of claim 12, wherein the pre-erase voltage has a lower potential level than the first erase voltage.

16. The method of claim 15, wherein a source select line of the memory cell block has a ground voltage level when the pre-erase voltage is applied to the source line, and the source select line is controlled to be in a floating state when the first erase voltage and the second erase voltage are applied to the source line.

17. The method of claim 12, further comprising:
performing an erase verify operation after applying the second erase voltage to the source line; and
increasing the second erase voltage and applying the increased second erase voltage to the source line when a result of the erase verify operation is determined as a fail.

* * * * *